US012598826B2

(12) United States Patent
Blake, III

(10) Patent No.: US 12,598,826 B2
(45) Date of Patent: Apr. 7, 2026

(54) IMAGE SENSOR ASSEMBLY

(71) Applicant: ZF Friedrichshafen AG, Friedrichshafen (DE)

(72) Inventor: Thomas E. Blake, III, Novi, MI (US)

(73) Assignee: ZF Friedrichshafen AG, Friedrichshafen (DE)

( * ) Notice: Subject to any disclaimer, the term of this patent is extended or adjusted under 35 U.S.C. 154(b) by 573 days.

(21) Appl. No.: 18/157,540

(22) Filed: Jan. 20, 2023

(65) Prior Publication Data

US 2024/0250099 A1 Jul. 25, 2024

(51) Int. Cl.

| | |
|---|---|
| ***H05K 1/02*** | (2006.01) |
| ***H05K 1/03*** | (2006.01) |
| ***H10F 39/00*** | (2025.01) |

(52) U.S. Cl.

CPC ......... *H10F 39/804* (2025.01); *H05K 1/0278* (2013.01); *H05K 1/0393* (2013.01)

(58) Field of Classification Search

CPC ....... H05K 1/02; H05K 1/0278; H05K 1/0393

USPC .......................................................... 361/749

See application file for complete search history.

(56) References Cited

U.S. PATENT DOCUMENTS

2015/0282304 A1* 10/2015 Ely ...................... H05K 1/0281 174/254

* cited by examiner

*Primary Examiner* — Tremesha W Burns

(74) *Attorney, Agent, or Firm* — Kristin L. Murphy

(57) ABSTRACT

An image sensor assembly is disclosed herein that can include a flexible substrate having a top surface and a bottom surface. The flexible substrate includes a body portion, an outer portion, and an elongated portion that extends from the body portion. The image sensor assembly also includes at least one rigid layer disposed over at least one of the top surface or the bottom surface of the body portion of the flexible substrate. The image sensor assembly also includes a rigid metallic structure disposed on the bottom surface of the body portion.

4 Claims, 9 Drawing Sheets

IMAGE SENSOR ASSEMBLY

TECHNICAL FIELD

The present disclosure relates to electronics and, more specifically, relates to an image sensor assembly including a flexible substrate having one or more rigid layers disposed over one or more surfaces of the flexible substrate.

BACKGROUND

Flexible printed circuits (FPCs) can be used in a wide range of vehicle applications for mounting sensors, such as image sensors, rain sensors, proximity sensors, light sensors, etc., used to assist operation of a vehicle. The sensor(s) can be secured to the FPCs with electrically conductive solder. The FPCs can be connected to other FPCs, motherboards, or other components by fasteners, adhesive, and/or compression between enclosure components.

Specially designed reflow solder pallets may be required when manufacturing FPCs, which can increase manufacturing costs. Additionally, some FPCs incorporate zero-insertion connectors (ZIFs), which can provide a difficult testing environment as compared to FPCs that incorporate relatively larger testing points.

SUMMARY

An image sensor assembly is disclosed herein that can include a flexible substrate having a top surface and a bottom surface. The flexible substrate includes a body portion, an outer portion, and an elongated portion that extends from the body portion. The image sensor assembly also includes at least one rigid layer disposed over at least a portion of one of the top surface or the bottom surface of the body portion of the flexible substrate. The image sensor assembly also includes a rigid metallic structure disposed on the bottom surface of the body portion.

In another exemplary arrangement, the image sensor assembly includes an image sensor disposed on the top surface of the body portion.

In another exemplary arrangement, the rigid metallic structure is mounted to the bottom surface of the body portion such that the rigid metallic structure overlaps with the image sensor.

In another exemplary arrangement, the rigid metallic structure is mounted to the bottom surface of the body portion such that the rigid metallic structure overlaps with the image sensor.

In another exemplary arrangement, the at least one rigid layer comprises a glass-reinforced epoxy laminate material.

In another exemplary arrangement, the at least one rigid layer is mounted directly to the at least one of the top surface or the bottom surface.

In another exemplary arrangement, the image sensor assembly includes a connector mounted to an end section of the elongated portion spaced from the body portion.

In another exemplary arrangement, the connector comprises at least one of a surface-mounted board-to-board (BTB) connector or a zero-insertion force (ZIF) interface.

In another exemplary arrangement, the rigid metallic structure comprises a metal rigidizer.

In another exemplary arrangement, the outer portion of the flexible substrate is sandwiched between a first rigid layer and a second rigid layer.

An image sensor assembly can include a flexible substrate having a top surface and a bottom surface. The flexible substrate includes a body portion, an outer portion, and an elongated portion that extends between the body portion and the outer portion. An image sensor can be disposed on the top surface of the body portion. The image sensor assembly also includes at least one rigid layer disposed over at least one of the top surface or the bottom surface of the body portion of the flexible substrate. The image sensor assembly also includes a rigid metallic structure disposed over the bottom surface of the body portion.

In another exemplary arrangement, the image sensor assembly includes an image sensor disposed over the top surface of the body portion.

In another exemplary arrangement, the rigid metallic structure is mounted to the bottom surface of the body portion such that the rigid metallic structure overlaps with the image sensor.

In another exemplary arrangement, the rigid metallic structure is mounted to the bottom surface of the body portion such that the rigid metallic structure overlaps with the image sensor.

In another exemplary arrangement, the at least one rigid layer comprises a glass-reinforced epoxy laminate material.

In another exemplary arrangement, the at least one rigid layer is mounted directly to the at least one of the top surface or the bottom surface.

In another exemplary arrangement, the image sensor assembly includes a connector mounted to an end section of the elongated portion spaced from the body portion.

In another exemplary arrangement, the connector comprises at least one of a surface-mounted board-to-board (BTB) connector or a zero-insertion force (ZIF) interface.

In another exemplary arrangement, the rigid metallic structure comprises a metal rigidizer.

In another exemplary arrangement, the outer portion of the flexible substrate is sandwiched between a first rigid layer and a second rigid layer.

In another exemplary arrangement, the top surface of the body portion is absent the at least one rigid layer.

In another exemplary arrangement, the image sensor assembly includes a plurality of testing points.

In another exemplary arrangement, the plurality of testing points each comprise an electrically conductive pad.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

The present disclosure describes one or more exemplary arrangements of an image sensor assembly that includes a flexible substrate, such as a flexible printed circuit board. The image sensor assembly can eliminate the requirement for specially designed reflow solder pallets by incorporating the use of rigid layers. Additionally, the image sensor assembly, in some exemplary arrangements, can use surface-mounted board-to-board (BTB) connector that allow for the use of test points for focusing and calibration.

An image sensor can be mounted on the flexible substrate. In various exemplary arrangements, the image sensor assembly can include various rigid layers and/or a rigid metallic structure to mitigate potential damage to one or more components of the image sensor assembly, as discussed in greater detail herein.

Figure 1A:
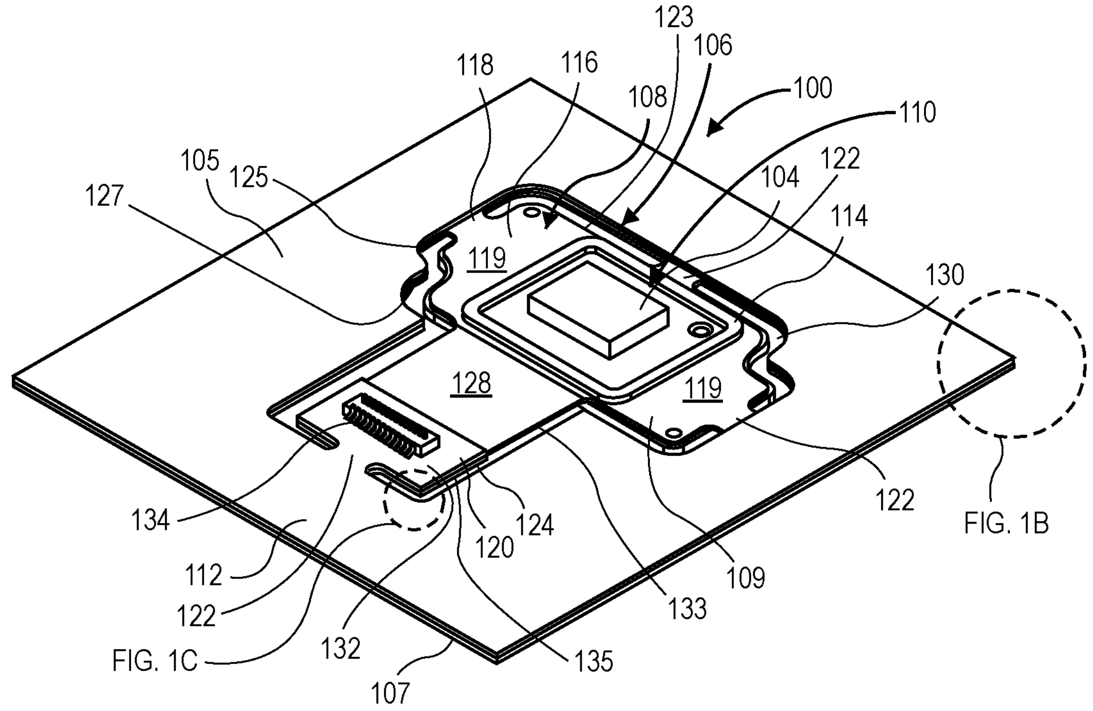
FIG. 1A is an isometric plan view of an image sensor assembly according to an exemplary arrangement of the present disclosure.
Figure 1B:
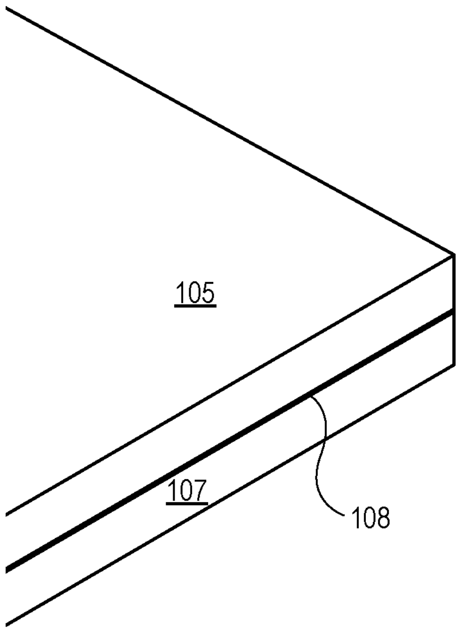
FIG. 1B is an enlarged isometric plan view of a portion of the image sensor assembly in encircled area 1B illustrated in FIG. 1A according to an exemplary arrangement of the present disclosure.
Figure 1C:
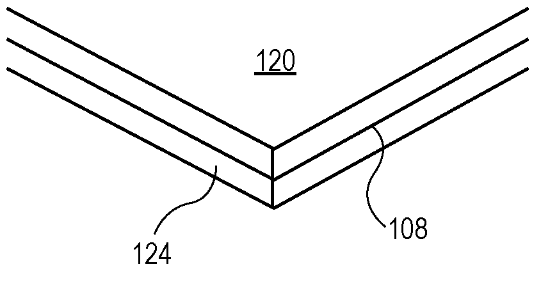
FIG. 1C is an enlarged isometric plan view of a portion of the image sensor assembly in encircled area 1C illustrated in FIG. 1A according to an exemplary arrangement of the present disclosure.
Figure 2:
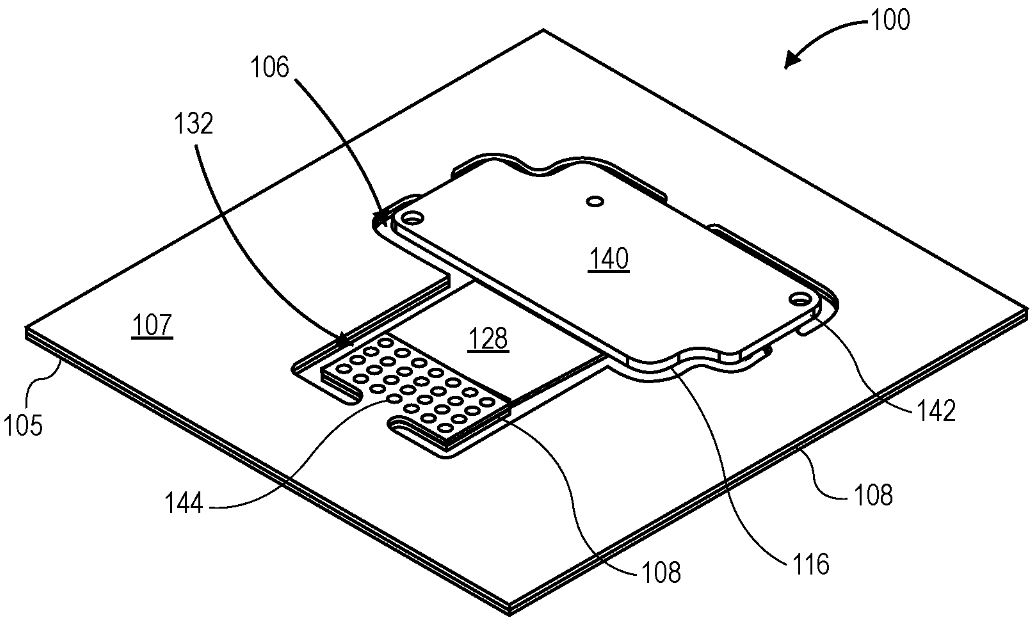
FIG. 2 is an isometric bottom view of the image sensor assembly according to an exemplary arrangement of the present disclosure.

FIGS. 1A through 2 illustrate an image sensor assembly 100 according to an exemplary arrangement. The image sensor assembly 100 includes an image sensor 104 mounted to a flexible substrate 108. The flexible substrate 108 is sandwiched between top 105 and bottom layers 107 of a base member 110. An opening 106 is formed through the base member 110 such that the flexible substrate 108 is positioned within the opening 106. A body portion 116 of the substrate 108 is attached to an inner peripheral edge 118 of the base member 110 by one or more tabs 122. It is understood that the body portion 116 can be removed from the outer portion during the manufacturing process. For example, the body portion 116 can be separated from the outer portion by breaking the tabs 122.

In exemplary arrangements, the top and bottom layers 105, 107 of the base member 110 are constructed to be rigid. For example, in one exemplary arrangement, the top and bottom layers 105, 107 comprise a glass-reinforced epoxy laminate material mounted directly to the top and/or the bottom surface of the flexible substrate 108. In various exemplary arrangements, the rigid layers 105, 107 comprises an FR-4 glass epoxy material.

As shown in FIGS. 1A, the image sensor 104 is attached, e.g., mounted, to a top surface 119 of the body portion 116. An adhesive material 114 can also be applied to the top surface 119. In an exemplary arrangement, the adhesive material 114 comprises a suitable adhesive material that is used to retain a lens structure (not shown) when positioned over the body portion 116. The adhesive material can comprise an epoxy material, such as a cationic epoxy material.

In an exemplary arrangement, the flexible substrate 108 comprises a flexible printed circuit board 109. The flexible printed circuit board 109 can comprise a polyimide laminate material in one or more exemplary arrangements.

In one exemplary arrangement, as generally shown in FIGS. 1A through 1C, an elongated portion 128 of the flexible substrate 108 extends from the body portion 116. As shown, an end section 132 of the elongated portion 128 is sandwiched between top and bottom layers 120, 124 of rigid material. In one exemplary arrangement, the rigid material of top and bottom layers 120, 124 are the same as the material used for first and second layers 105, 107. The end portion 132 is connected to the base member 110 by the elongated portion 128, with the elongated portion 128 serving to space the end section 132 from the body portion 116.

The elongated portion 128 and the end section 132 are each defined by peripheral edges 133 and 135 that are spaced inbound from inner peripheral edges 125 and 127 of the top and bottom layers 105 and 107 so as to create the opening 106 therebetween.

As shown in FIG. 1A, a connector 134 is mounted on to the top layer 120 of the end section 132. The connector 134 can comprise an electrical connector that facilitates the transfer of electrical signals to and/or from the image sensor 104. In an exemplary arrangement, the connector 134 can comprise a surface-mounted board-to-board (BTB) connector. In another exemplary arrangement, the connector 134 comprises a zero-insertion force (ZIF) interface.

The image sensor 104 can sense and/or capture an image and provide one or more electrical signals to a control system of a vehicle safety system representing the image.

Referring to FIG. 2, a rigid metallic structure 140 is attached to an underside of the body portion 116. The rigid metallic structure 140 is sized and shaped so as to generally be disposed within the opening 106 of the base member 110. In a further exemplary arrangement, a peripheral edge 142 of the rigid metallic structure 140 cooperates with the inner peripheral edges 125 and 127 of the top and bottom layers 105 and 107 to maintain the opening 106 therebetween.

In an exemplary arrangement, the rigid metallic structure 140 comprises a metal rigidizer that is bonded to the polyimide laminate material using a suitable bonding material. The rigid metallic structure 140 can serve to provide thermal management to the image sensor assembly 100. For instance, the rigid metallic structure 140 can function as a heat sink such that heat is transferred from the image sensor 104 and/or the body portion 116 to the rigid metallic structure 140. In various exemplary arrangements, the rigid metallic structure 140 can be mounted to a bottom surface of the body portion 116 such that the rigid metallic structure 140 overlaps with the image sensor 104. It is understood that the bottom surface comprises the surface opposite the surface for which the image sensor 104 is mounted.

A bottom surface of the bottom layer 124 of the end section 132 may include one or more testing points 144. In an exemplary arrangement, the testing points 144 comprise exposed electrically conductive pads, such as copper or the like. Probes or other suitable electronic testing equipment can be connected to the testing points 144 to inject test signals and/or monitor a state of the image sensor assembly 100 during manufacturing.

Figure 3:
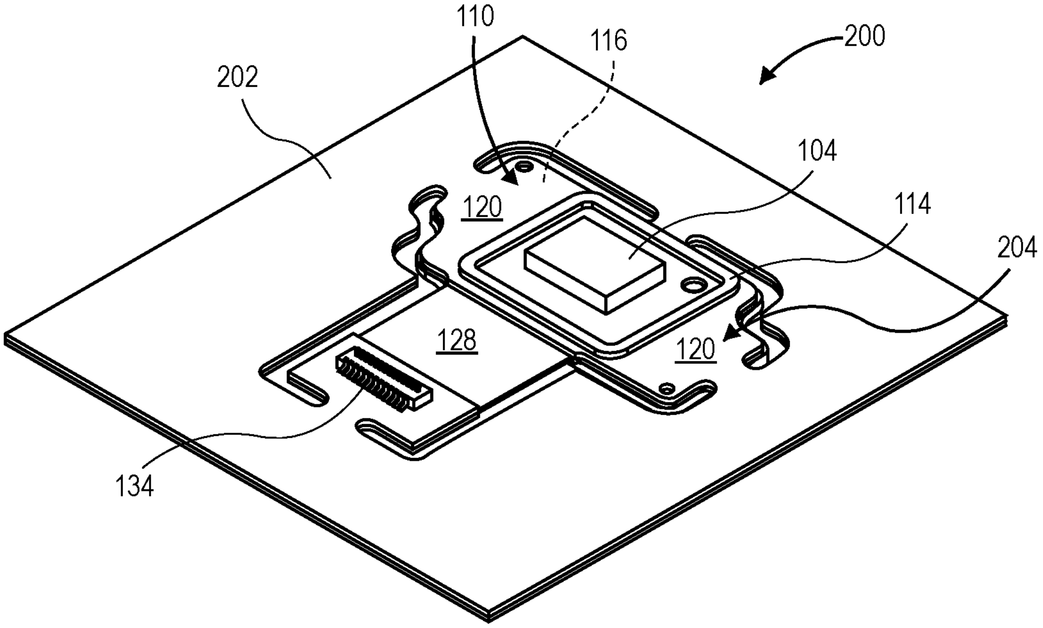
FIG. 3 is an isometric plan view of the image sensor assembly according to an exemplary arrangement of the present disclosure.
Figure 4:
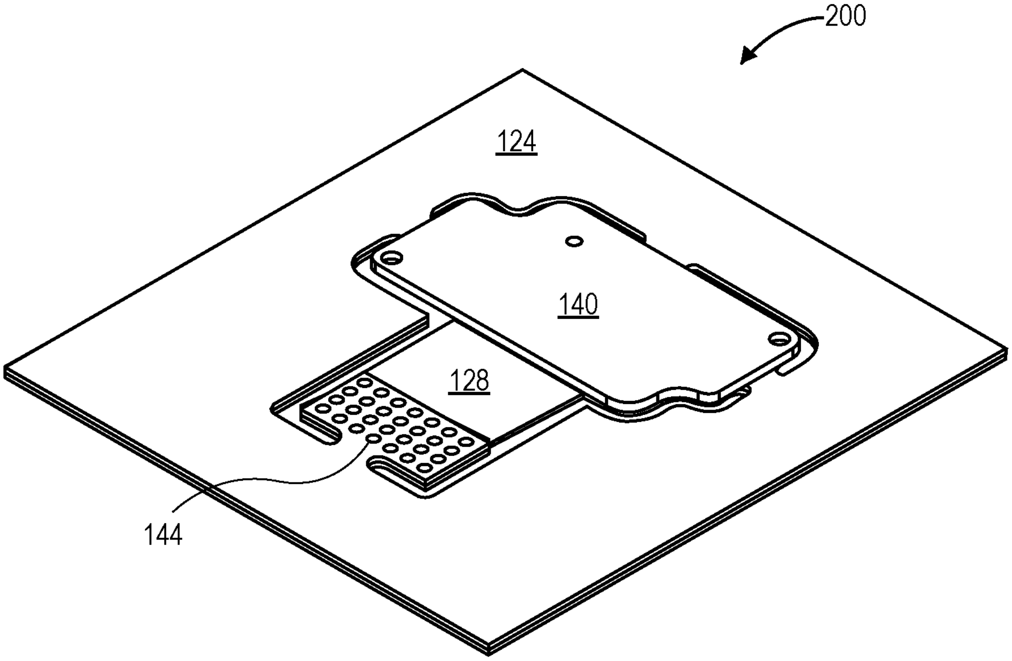
FIG. 4 is an isometric bottom view of the image sensor assembly according to an exemplary arrangement of the present disclosure.

FIGS. 3 and 4 illustrate another exemplary arrangement of an image sensor assembly 200. The same reference numerals are used below for the same structures having the same functions as those structures that were described above.

As shown in FIGS. 3 and 4, and in contrast to the exemplary arrangement shown in FIGS. 1 and 2, the body portion 116 of the flexible substrate 108 is disposed, e.g., sandwiched, between a top layer 202 of rigid material and the rigid metallic structure 140. In a further exemplary arrangement, the image sensor 104 is attached to the top layer 202, and the adhesive material 114 is also applied to a top surface 204 of the first top layer 202. All remaining elements of the image sensor arrangement is as shown in the exemplary arrangement 100 depicted in FIGS. 1 and 2.

Figure 5:
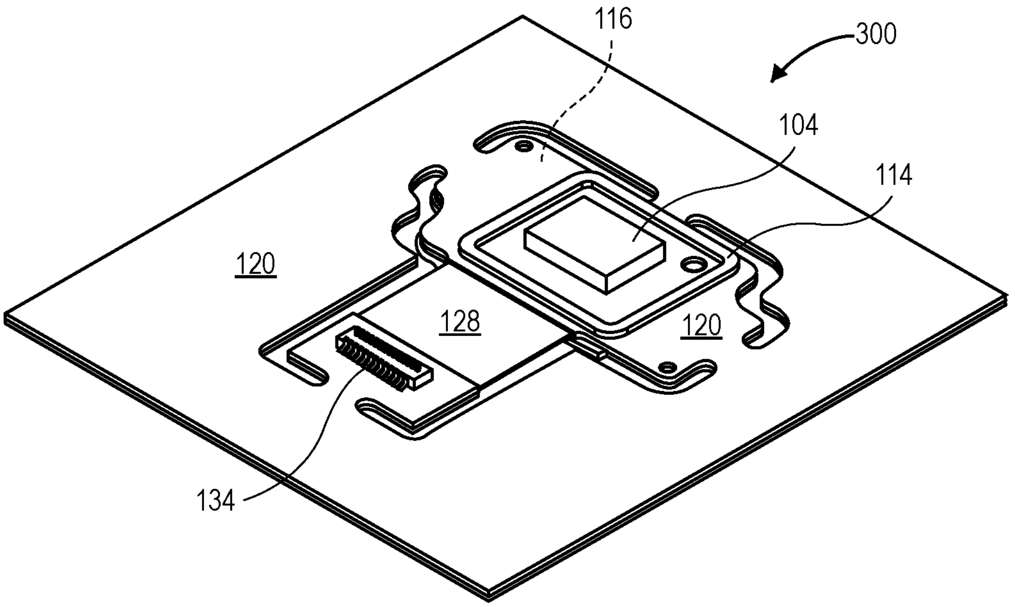
FIG. 5 is an isometric plan view of the image sensor assembly according to an exemplary arrangement of the present disclosure.
Figure 6:
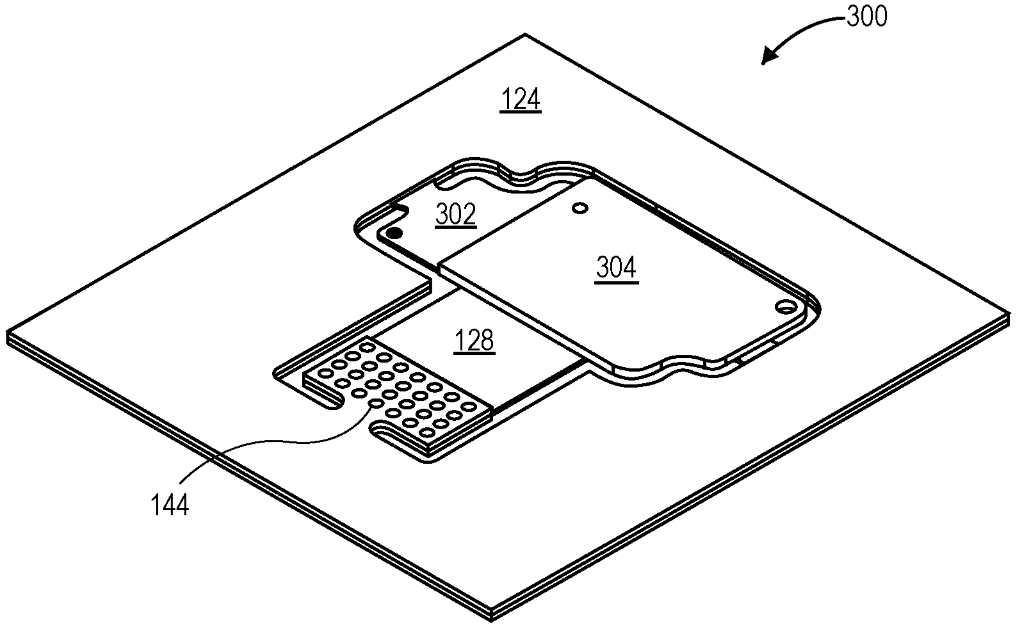
FIG. 6 is an isometric bottom view of the image sensor assembly according to an exemplary arrangement of the present disclosure.

FIGS. 5 and 6 illustrate another exemplary arrangement of an image sensor assembly 300. Arrangement 300 is similar to arrangement 200 illustrated in FIGS. 3 and 4. More specifically, as shown in FIG. 6, a portion 302 of the body portion 116 is exposed on the bottom side of the image sensor assembly 300 such that one or more electronic components of the flexible printed circuit can be disposed on both surfaces of the body portion 116. In other words, the exposed portion 302 can also retain one or more electronic components since the exposed portion 302 is not covered by a rigid metallic structure 304. All remaining elements of the image sensor arrangement 300 is as shown in the exemplary arrangement 200 depicted in FIGS. 3 and 4.

Figure 7:
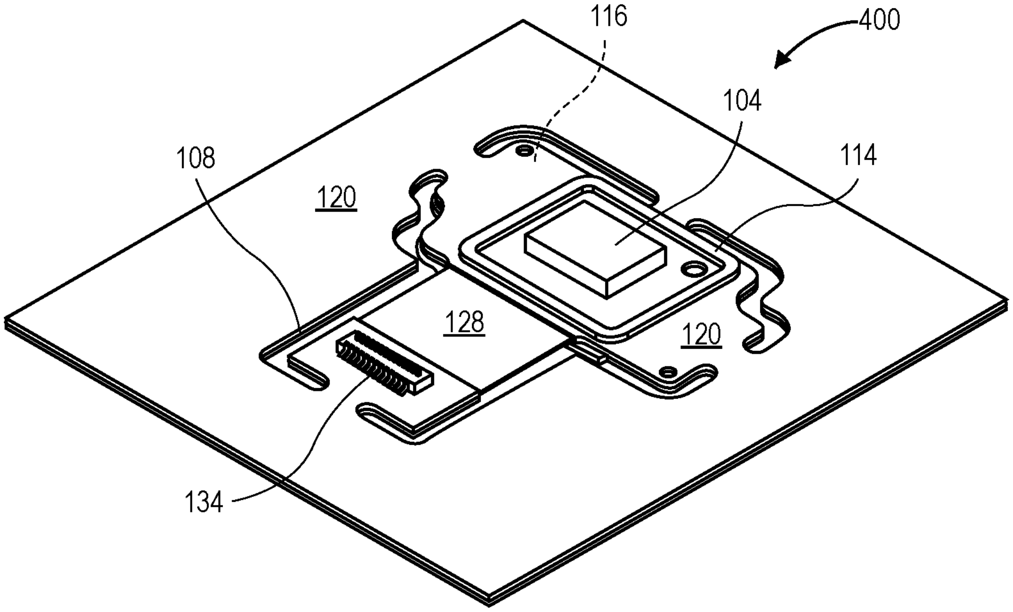
FIG. 7 is an isometric plan view of the image sensor assembly according to an exemplary arrangement of the present disclosure.
Figure 8:
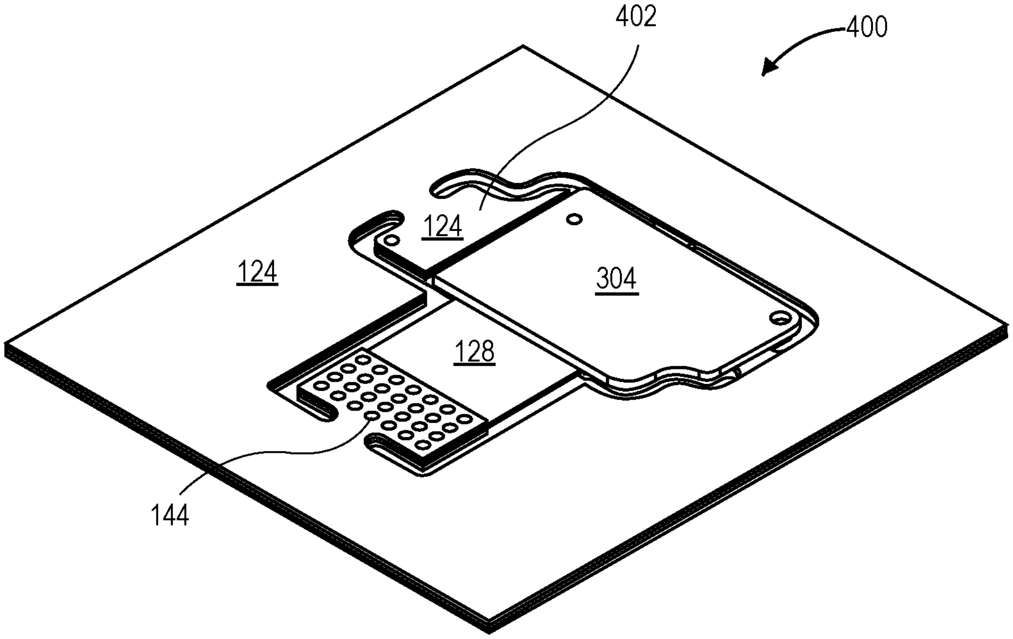
FIG. 8 is an isometric bottom view of the image sensor assembly according to an exemplary arrangement of the present disclosure.

FIGS. 7 and 8 illustrate yet another exemplary arrangement of the image sensor assembly 400. Arrangement 400 is similar to arrangement 200 illustrated in FIGS. 3 and 4. In the exemplary arrangement shown in FIGS. 7 and 8, a portion 402 of the body portion is covered by the rigid layer 107. In this exemplary arrangement, electronic components of the flexible printed circuit can be disposed on the rigid layers 105, 107. All remaining elements of the image sensor arrangement 400 is as shown in the exemplary arrangement 200 depicted in FIGS. 3 and 4.

Figure 9:
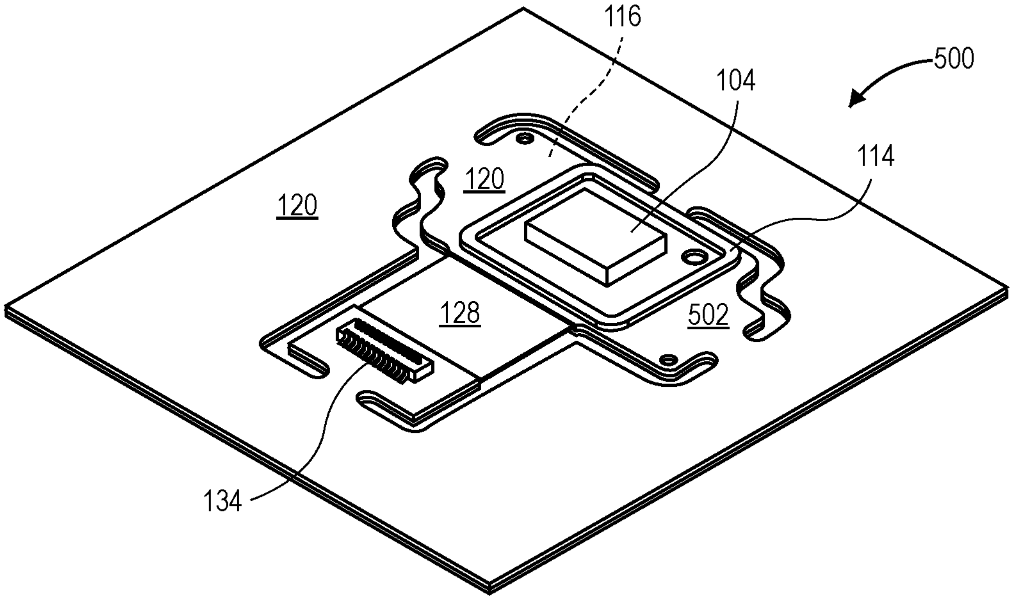
FIG. 9 is an isometric plan view of the image sensor assembly according to an exemplary arrangement of the present disclosure.
Figure 10:
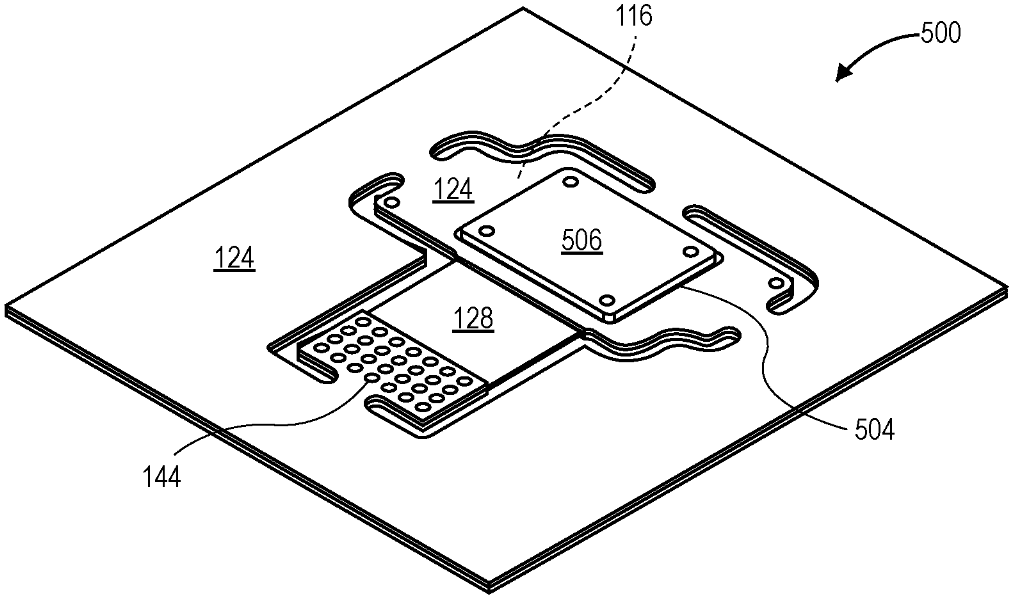
FIG. 10 is an isometric bottom view of the image sensor assembly according to an exemplary arrangement of the present disclosure.

FIGS. 9 and 10 illustrate another exemplary arrangement of the image sensor assembly 500. As shown, the body portion 116 is an extension of the first rigid layer 105 and the second rigid layer 107. In this exemplary arrangement, the image sensor 104 is attached to the first rigid layer 105, and the adhesive material 114 is applied to a surface 502 of the first rigid layer 105.

As shown in FIG. 10, the second rigid layer 124 defines an aperture therein 504 that exposes a surface of the body portion 116 which is sandwiched between the first and second layers 105 and 107 as described in FIGS. 1 and 2. In one exemplary arrangement, the aperture 504 is configured with a size and shape that receives a correspondingly sized and shaped rigid metallic structure 506. The rigid metallic structure 506 can be attached to the exposed body portion 116 surface such that the rigid metallic structure 506 functions as a heat sink for the image sensor 104. All remaining elements of the image sensor arrangement 500 is as shown in the exemplary arrangement 100 depicted in FIGS. 1 and 2.

Figure 11:
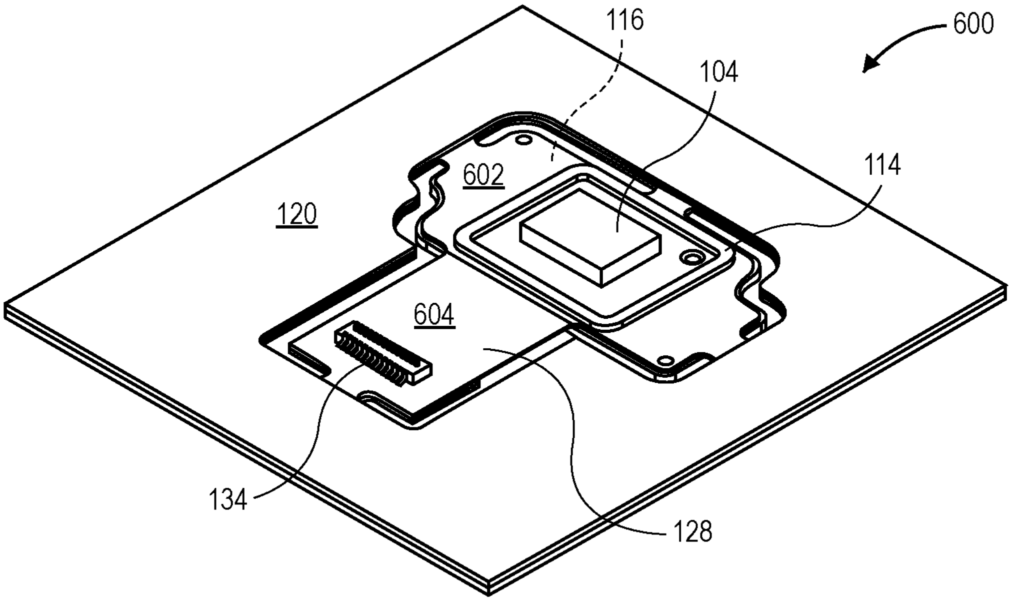
FIG. 11 is an isometric plan view of the image sensor assembly according to an exemplary arrangement of the present disclosure.
Figure 12:
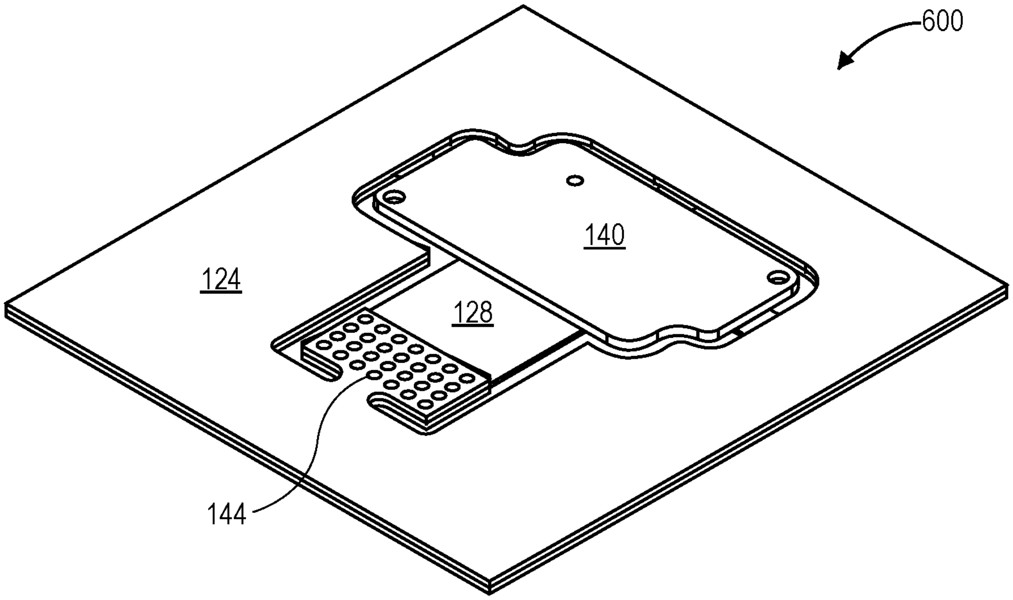
FIG. 12 is an isometric bottom view of the image sensor assembly according to an exemplary arrangement of the present disclosure.

FIGS. 11 and 12 illustrate another exemplary arrangement of an image sensor assembly 600. As shown, an upper surface 602 of the body portion 116 and an upper surface 604 of the elongated portion 128 are exposed, i.e., absent the first rigid layer 105, such that surface-mount devices, e.g., electronic devices, can be mounted on a common plane, i.e., the upper surfaces 602, 604. As shown in FIG. 11, the first rigid layer 105 covers an outer portion of the flexible substrate 108, similar to that shown in FIGS. 1 and 2. All remaining elements of the image sensor arrangement 600 is as shown in the exemplary arrangement 100 depicted in FIGS. 1 and 2.

Figure 13:
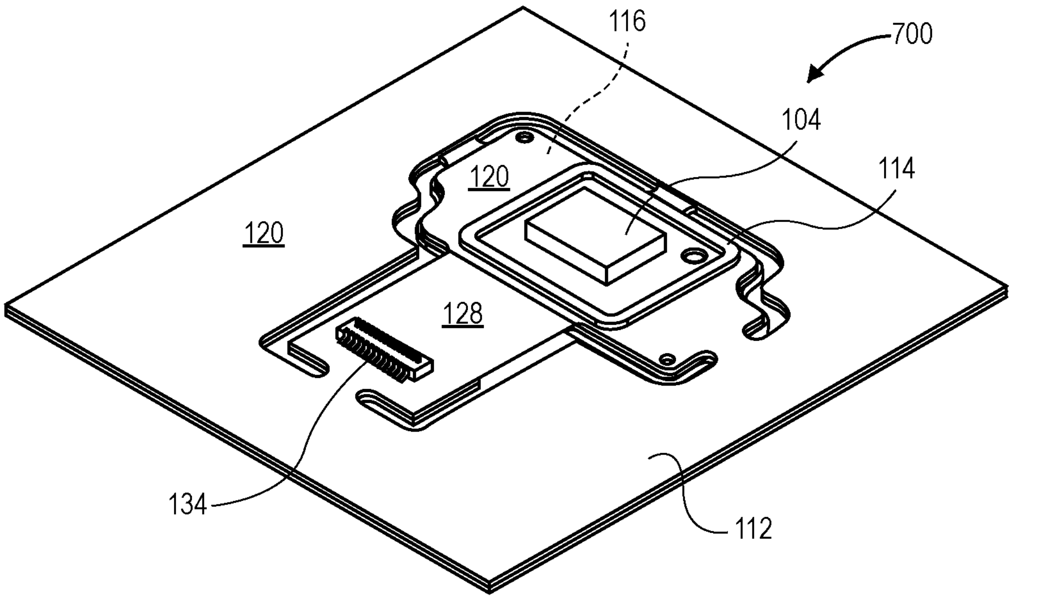
FIG. 13 is an isometric plan view of the image sensor assembly according to an exemplary arrangement of the present disclosure.
Figure 14:
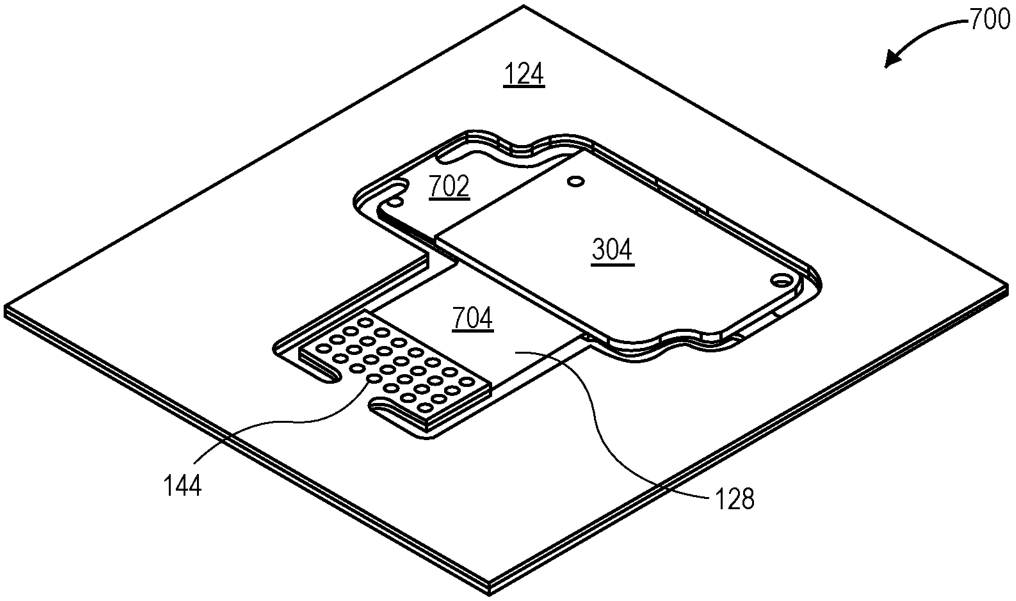
FIG. 14 is an isometric bottom view of the image sensor assembly according to an exemplary arrangement of the present disclosure.

FIGS. 13 and 14 illustrate another exemplary arrangement of an image sensor assembly 700. As shown in FIG. 13, an upper portion of the image sensor assembly 700 is configured similarly to the exemplary arrangement described above with respect to FIG. 3. As shown in FIG. 14, a bottom surface 702 and a bottom surface 704 of the elongated portion 128 are exposed, i.e., absent the bottom rigid layer 107. All remaining elements of the image sensor arrangement 700 is as shown in the exemplary arrangement 100 depicted in FIGS. 1 and 2 and/or the exemplary arrangement 300 depicted in FIGS. 5 and 6.

Figure 15:
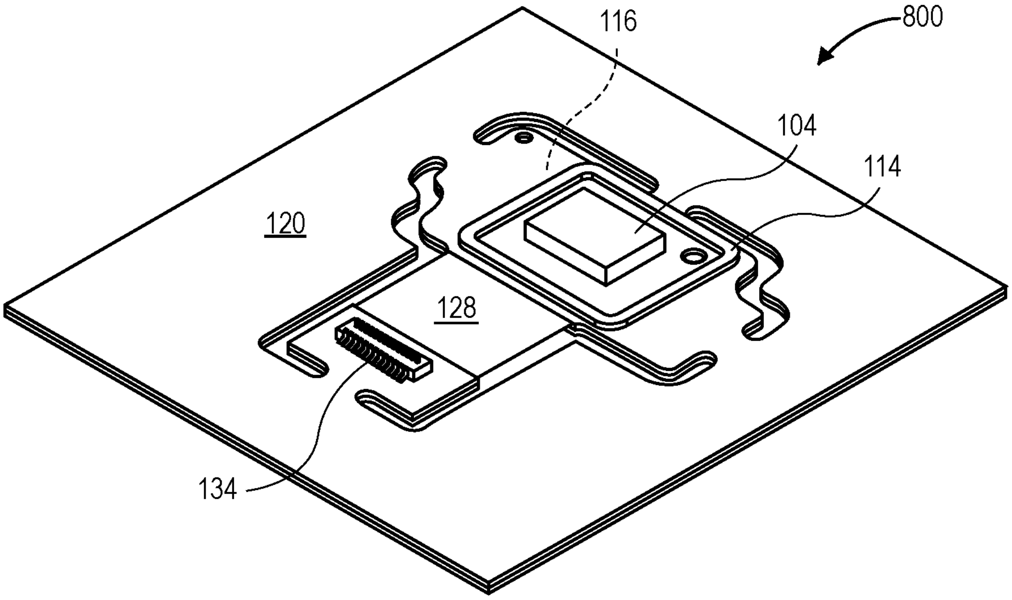
FIG. 15 is an isometric plan view of the image sensor assembly according to an exemplary arrangement of the present disclosure.
Figure 16:
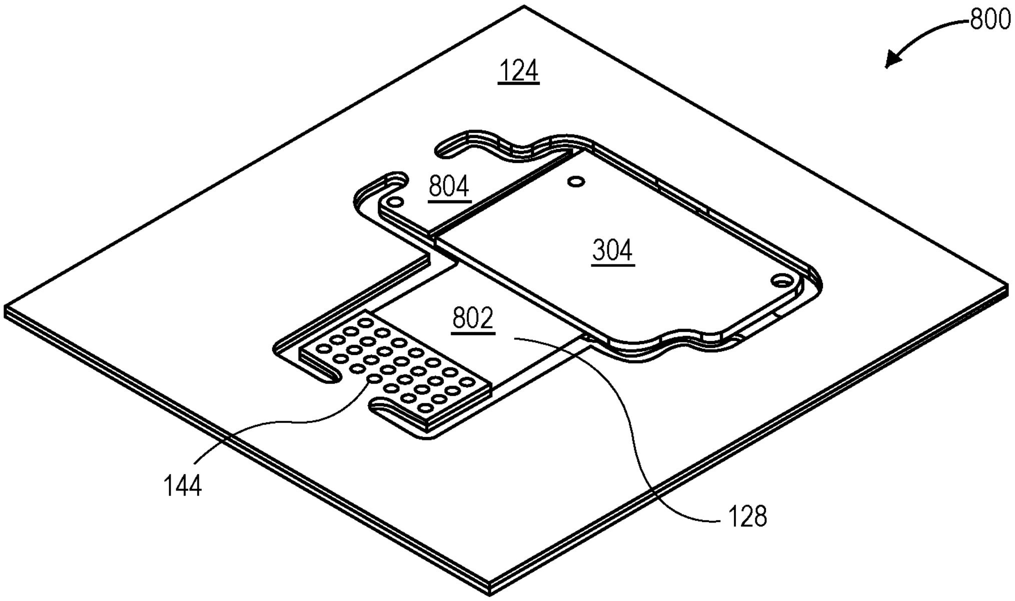
FIG. 16 is an isometric bottom view of the image sensor assembly according to an exemplary arrangement of the present disclosure.

FIGS. 15 and 16 illustrate another exemplary arrangement of an image sensor assembly 800. As shown in FIG. 15, an upper portion of the image sensor assembly 800 is configured similarly to the exemplary arrangement described above with respect to FIG. 13. As shown in FIG. 16, the bottom surface 802 of the elongated portion 128 is exposed, i.e., absent the second rigid layer 107. In this exemplary arrangement, a rigid metallic structure 304 and a rigid layer 804 are attached to the underside of the body portion 116. As shown, the rigid metallic structure 304 and the rigid layer 804 are adjacent to one another. All remaining elements of the image sensor arrangement 800 is as shown in the exemplary arrangement 100 depicted in FIGS. 1 and 2 and/or the exemplary arrangement 300 depicted in FIGS. 5 and 6.

Accordingly, it is to be understood that the above description is intended to be illustrative and not restrictive. Many implementations and applications other than the examples provided would be apparent to those of skill in the art upon reading the above description. The scope of the disclosure should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future implementations. In sum, it should be understood that the invention is capable of modification and variation and is limited only by the following claims.

All terms used in the claims are intended to be given their plain and ordinary meanings as understood by those skilled in the art unless an explicit indication to the contrary is made herein. In particular, use of the singular articles such as “a,” “the,” “said,” etc. should be read to recite one or more of the indicated elements unless a claim recites an explicit limitation to the contrary.

What is claimed is:

1. An image sensor assembly, comprising:

a flexible substrate including a body portion, an outer portion, and an elongated portion that extends from the body portion, the flexible substrate having a top surface and a bottom surface, the elongated portion having a proximal end and a distal end relative to the body portion;

an image sensor disposed on the top surface of the body portion;

a first rigid layer comprising a glass-reinforced epoxy laminate material disposed over the top surface of the body portion to the proximal end;

a second rigid layer comprising a glass-reinforced epoxy laminate material disposed over the bottom surface of the body portion to the proximal end; and a rigid metallic structure disposed directly on at least a portion of the bottom surface of the body portion such that the rigid metallic structure directly overlaps the image sensor, wherein the rigid metallic structure comprises a heat sink configured to transfer heat from the image sensor, wherein the first rigid layer and the second rigid layer sandwich the distal end of the elongated portion such that the elongated portion is exposed between the proximal end and the distal end.

2. The image sensor assembly as recited in claim 1, further comprising a connector mounted to an end section of the elongated portion spaced from the body portion.

3. The image sensor assembly as recited in claim 2, wherein the connector comprises at least one of a surface-mounted board-to-board (BTB) connector or a zero-insertion force (ZIF) interface.

4. The image sensor assembly as recited in claim 1, wherein the rigid metallic structure comprises a metal rigidizer.

* * * * *